United States Patent
Hareyama

(10) Patent No.: US 6,538,506 B2
(45) Date of Patent: Mar. 25, 2003

(54) MATCHING APPARATUS

(75) Inventor: Nobuo Hareyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/934,403

(22) Filed: Aug. 21, 2001

(65) Prior Publication Data

US 2002/0044016 A1 Apr. 18, 2002

(30) Foreign Application Priority Data

Aug. 23, 2000 (JP) ........................................ 2000-252647

(51) Int. Cl.[7] ................................................. H03F 1/14
(52) U.S. Cl. .......................................... 330/51; 330/129
(58) Field of Search ........................ 330/51, 129, 207 P

(56) References Cited

U.S. PATENT DOCUMENTS

| | | | | |
|---|---|---|---|---|
| 5,276,912 A | * | 1/1994 | Siwiak et al. ................ 330/284 |
| 5,408,691 A | | 4/1995 | Takao .......................... 455/127 |
| 5,423,074 A | * | 6/1995 | Dent ............................ 330/129 |
| 5,564,086 A | | 10/1996 | Cygan et al. ................. 455/129 |
| 5,939,941 A | * | 8/1999 | Nair et al. .................... 330/251 |
| 5,973,568 A | * | 10/1999 | Shapiro et al. .............. 330/295 |
| 6,215,359 B1 | * | 4/2001 | Peckham et al. ............ 330/145 |

FOREIGN PATENT DOCUMENTS

| | | |
|---|---|---|
| JP | 10163889 | 6/1998 |
| WO | 9112671 | 8/1991 |

* cited by examiner

*Primary Examiner*—My-Trang Nu Ton
(74) *Attorney, Agent, or Firm*—Jay H. Maioli

(57) ABSTRACT

A matching apparatus for matching impedances of a power amplifier and an antenna of a terminal apparatus in which transmission power control (TPC) is carried out between a base station and a portable wireless telephone set. The matching apparatus can transmit output power at excellent output efficiency regardless of the magnitude of the power of transmission output. A matching circuit provided between a power amplifier and a load includes a switching device, and impedances are switched and controlled by the switching device such that the impedances are suited to the transmission output power required for TPC and are properly matched.

3 Claims, 4 Drawing Sheets

MATCHING APPARATUS

BACKGROUND OF THE INVENTION

1. Field of the Invention

The present invention relates to a matching apparatus capable of matching input and output impedances between a power amplifying circuit and an antenna (load) for use in a portable wireless telephone set.

2. Description of the Related Art

Heretofore, official gazette of Japanese laid-open patent application No. 10-163889 has disclosed an automatic impedance matching system for automatically matching input and output impedances between a power amplifier and a load such as an antenna of a portable wireless telephone set.

FIG. 8 shows a matching apparatus capable of matching the power amplifier and the load disclosed in the above official gazette.

As shown in FIG. 8, a load impedance (including a matching circuit) detector 2 is provided between a power amplifier 1 and an antenna (load) 4, and a matching circuit 3 is controlled by a detection signal. The load impedance detector 2 detects the impedance as an R (resistance) and a Φ (phase) respectively, and the detection signal is converted in the form of analog-to-digital signal by an A/D converter 5 and inputted to a microcomputer (CPU) 8. The CPU 8 drives a drive circuit 7 such as a motor or a relay and controls the matching circuit 3 in such a manner that the values of the R and the Φ of the detection signal may be matched to the output impedance of the power amplifier 1.

The load impedance detector 2 is correctly adjusted in such a manner that a detection signal voltage of a load impedance becomes equal to a central value of a detection voltage under the state that input and output impedances obtained when the output impedance of the power amplifier 1 and the load impedance are matched with each other are 50Ω (pure resistance). For example, the load impedance detector is correctly adjusted such that a detection voltage obtained when the input and output impedances are 50Ω is set to 0 V, when the resistance R is larger than 50Ω, a positive voltage proportional to the R value may be detected, and when the resistance R is lower than 50Ω, a negative voltage which is inversely proportional to the R value may be detected. Further, the phase Φ also is correctly adjusted in such a manner that positive and negative voltages from a central value may be detected in proportion to the phase value similarly.

The load impedance detector 2 thus correctly adjusted is used and the resistance R and the phase Φ of the detection signal are inputted to the CPU 8. The CPU 8 variably controls the matching circuit 3 by driving the motor or relay drive circuit 7 in such a manner that the resistance R may constantly become equal to the corrected value of the impedance 50Ω by decreasing the resistance R with a positive voltage signal proportional to the resistance R or by increasing the resistance R with a negative voltage. Accordingly, the output impedance of the power amplifier 1 and the load side impedance can be matched at 50Ω. The matching of the phase Φ also can be controlled similarly.

With the above arrangement, when the output impedance of the power amplifier 1 is not matched to 50Ω, since the matching circuit 3 is controlled such that matching is conducted at 50Ω, the power amplifier 1 and the antenna 4 are not matched with each other completely and thereby displaced from each other. In particular, as the amplified band of the power amplifier 1 is increasing its width, the output impedance of the power amplifier 1 is changed depending upon frequency characteristics and hence the displacement of the aforesaid matching becomes remarkable.

In order to solve the above problem, the CPU 8 for controlling the matching circuit 3 by using a matching control program has the arrangement such that an impedance judgment threshold value in the matching control program can be changed in response to transmission frequencies by a judgment threshold value setting device 9.

According to the above arrangement, since the impedance judgment threshold value of the CPU 8 which control the matching circuit by the detection output is changed by an impedance changing means in response to the change of the output impedance of the power amplifier 1, when the output impedance of the power amplifier 1 is changed in response to the transmission frequency, even though the output impedance of the power amplifier 1 is displaced from the adjusted value by changing the impedance judgment threshold value with the transmission frequency the input and output impedances can reliably be matched with each other.

There arises a problem that the above conventional matching method needs the complex detector and various ICs such as the load impedance detector, the A/D converter, the motor relay drive circuit and the judgment threshold value setting device.

Further, in the above matching circuit, the impedance of the matching circuit is switched and compensated such that the output impedance in the power amplifier corresponds to the frequency. Specifically, although the frequency characteristic of the power amplifier receives an attention, in recent years, in a portable wireless telephone set and the like, there is executed a transmission power control (Transmission Power Control: hereinafter referred to as a TCP) which controls transmission power of a mobile station in such a manner that receiving power at the base station becomes the same in order to solve a near-far problem (near-far Problem) in a code division multiple access (Code Division Multiple Access: CDMA) or the like which receives an attention.

In the portable wireless telephone set of the terminal side in which such TCP is executed, an output efficiency of the power amplifier is not so excellent, and this output efficiency should be improved at the sacrifice of a stability. Accordingly, the stability is given a priority and the output efficiency is sacrificed.

Even when the output efficiency of the power amplifier is improved and the impedance is matched (matching) with the load at the maximum output power of the power amplifier in which the TPC, for example, is carried out, an output efficiency is extremely lowered at the portion in which the output power of the power amplifier is lowered as will be described later on.

SUMMARY OF THE INVENTION

The present invention is made in order to solve the above problem and the problem to be solved by the present invention is to provide a matching apparatus in which a matching circuit is switched and controlled in response to output power of a power amplifier without sacrificing both an output efficiency and a stability of the power amplifier.

According to the first invention, there is provided a matching apparatus which comprises a power amplifying means for transmitting output power based on a command for instructing an output, a matching means 2 connected between this power amplifying means 1 and a load 4 and a switching means 10 for switching input and output impedances of the matching means 2 based on a command for instructing the output power.

According to the second invention, in the matching apparatus according to the first invention, the switching means 10 is switched in multiple stages in response to a magnitude of output power from the power amplifying means 1.

According to the third invention, in the matching apparatus according to the first or second invention, when maximum output power is outputted from an output end of the power amplifying means 1, matching is conducted with the matching means 2 and when power is decreased from the maximum output power to predetermined output power, there is outputted a switching signal for switching the input and output impedances in which the matching means 2 is matched to the decreased predetermined output power.

According to the first invention to the third invention, the input and output impedances of the matching circuit are switched based on the output power instructing command from the base station and the like, whereby the detector can be constructed with ease. Therefore, there can be obtained the matching circuit in which the output efficiency and the stability are both satisfactory at the maximum output power and the small output power.

DESCRIPTION OF THE PREFERRED EMBODIMENTS

A matching apparatus for use with a portable wireless telephone set according to the present invention will be described in detail with reference to FIGS. 1 to 7.

Figure 1:
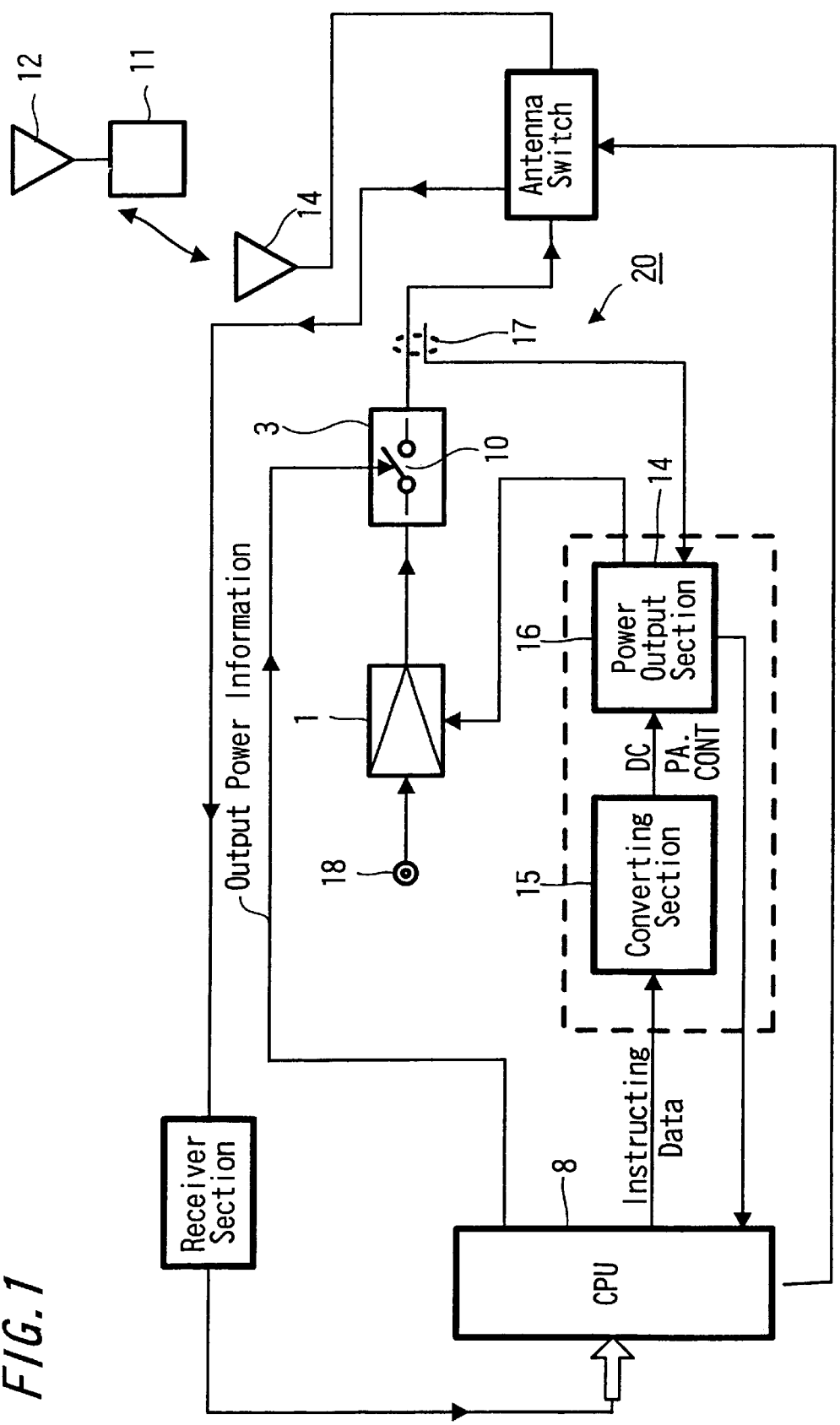
FIG. 1 is a block diagram of a main portion showing a matching apparatus of a portable wireless telephone set according to the present invention.

FIG. 1 is a block diagram of a main portion near a matching circuit according to the present invention, and illustrates a transmission output portion of a portable wireless telephone set in which TPC is carried out.

Figure 8:
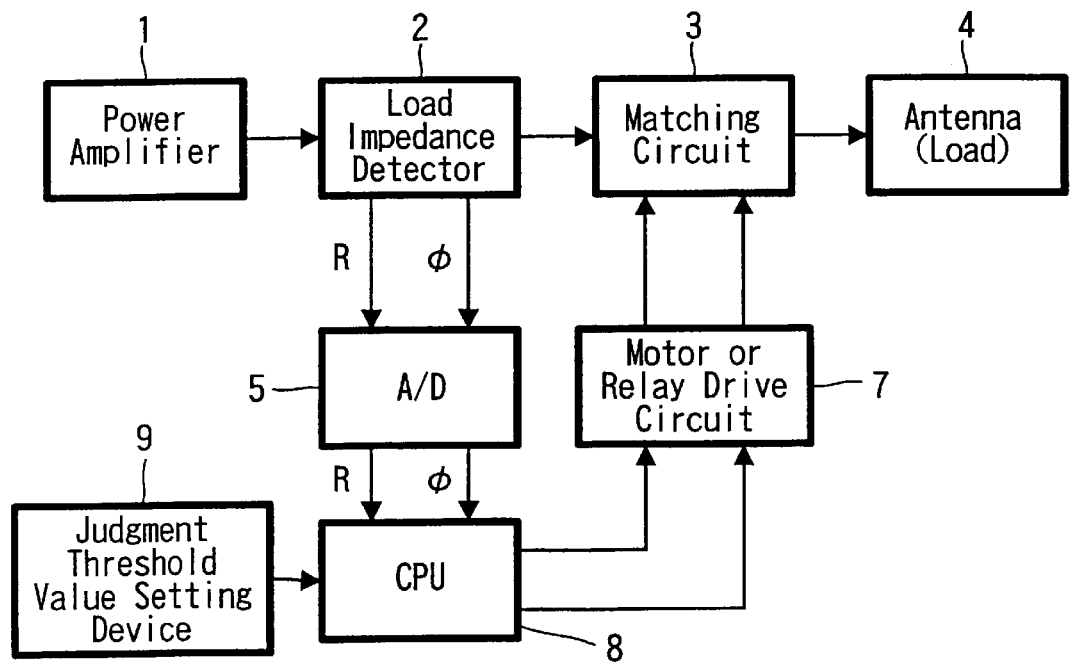
FIG. 8 is a block diagram to which reference will be made in explaining a matching circuit according to the prior art.

In FIG. 1, elements and parts corresponding to those of FIG. 8 are marked with the same reference numerals.

In FIG. 1 reference numeral 11 denotes a base station, and a TPC instructing signal for instructing a magnitude of a transmission power transmitted from each portable wireless telephone set is transmitted from a transmission antenna 12 to a reception antenna 4 of a matching apparatus 20 of a portable wireless telephone set comprising a terminal device.

An instruction signal from the reception antenna 4 is supplied through various processing circuits, not shown, to the microcomputer (hereinafter referred to as a CPU) 8.

A power detecting section 14 is adapted to control a transmission output power at every 2 dB as shown in the classes (class) 2 to 19 on a table 3, which will be described later on, based on the instructing signal received by the CPU 8 from the base station 11. The instructing signal from the base station 11 is supplied through the CPU 8 to a converting section 15 as instructing data. The converting section 15 converts the supplied instructing data into a power control DC signal. This signal from the converting section is supplied through a power output section 16 to the transmission power amplifier 1 so that the transmission output power of the power amplifier may be controlled.

The power amplifier 1 has at its input side an input terminal 18 to which a telephone transmitter signal is inputted from a telephone transmitter processing circuit and the like of a telephone transmitter at the preceding stage, not shown.

An output end of the power amplifier 1 is connected in series through the matching circuit 3 and a power detection coupler 17 for detecting present transmission power to the transmission antenna (transmission and reception) 4.

The present transmission power from the coupler 17 is attenuated to power value of a predetermined value, supplied to the power detecting section 14 and outputted to the CPU 18, whereby output power which is now being transmitted from the portable wireless telephone set, is transmitted to the base station 11 side as report data.

Accordingly, the portable wireless telephone set of the system in which the TPC is executed can receive present output power information of the power amplifier of the portable wireless telephone set from the CPU 8 without providing the load impedance detector shown in FIG. 8 in particular.

This present output power information is supplied from the CPU 8 to the matching circuit 3, whereby the switching means 10 provided within the matching circuit 3 is switched based on this output power information.

Figure 2:
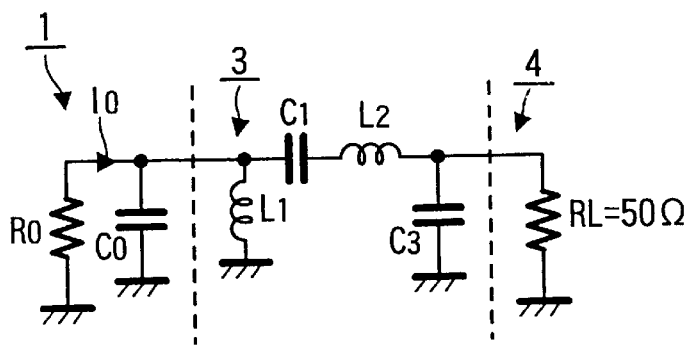
FIG. 2 is a fundamental matching circuit diagram for use in a matching apparatus according to the present invention.

FIG. 2 shows a fundamental circuit of the above matching circuit 3. In FIG. 2, reference letter $R_0$ denotes an output resistance of the power amplifier 1, $C_0$ denotes an output capacitance of the power amplifier 1 and $R_1$ denotes a load resistance. The matching circuit 3 is comprised of a first inductance $L_1$ whose one end is grounded, a series circuit of a first capacitance $C_1$ and a second inductance $L_2$ and a second capacitance $C_3$ whose one end is grounded. In this circuit, we have the following formula:

[Formula 1]

$$L_1 = \frac{XL_1}{\omega}, L_2 = \frac{XL_2}{\omega}$$

$$C_1 = \frac{1}{\omega \cdot XC_1}, C_2 = \frac{1}{\omega \cdot XC_3}$$

$$XL_1 = XC_0, XC_1 = Q \cdot R_0$$

$$XC_3 = R_L \cdot \sqrt{\frac{R_0}{R_L - R_0}}, XL_2 = XC_3 + R_0\sqrt{\frac{R_L}{XC_3}}$$

In FIG. 1, if ω=2πf is satisfied and Q=3, , $R_L$=50 and ω=5.65E9 are substituted into the above formula as real values, then we have the following values for $R_0$, $C_1$, $L_2$, $C_3$.

TABLE 1

| $R_0$ (Ω) | $C_1$ (pF) | $L_2$ (nH) | $C_3$ (pF) |
|---|---|---|---|
| 2 | 29.4 | 2.79 | 17.3 |
| 5 | 11.8 | 5.3 | 10.6 |
| 10 | 5.89 | 8.84 | 7.1 |
| 20 | 2.95 | 14.9 | 4.3 |

As is understood from this table 1, the value of the output resistance $R_0$ of the power amplifier 1 considerably changes from about 2Ω to about 20Ω depending on the transmission output power. It is also understood that the values of the impedances ($C_1$, $L_2$, $C_3$) obtained when impedances are properly matched within the matching circuit 2 in a range of from the low output resistance $R_0$=2Ω to the high output resistance $R_0$=20Ω are changed considerably A table 2 shows an output power (W), an output power (dBm) and an output current (A) obtained when they are actually measured at the above load resistance $R_L$=50Ω and the output resistance $R_0$=2Ω to 20Ω.

TABLE 2

| measured order | Power [W] | Power [dBm] | $I_0$ [A] | $R_0$ [Ohm] |
|---|---|---|---|---|
| 0 | 2.6800 | 34.700 | 1.2500 | 2.3900 |
| 1 | 2.4200 | 33.500 | 1.1500 | 3.4200 |
| 2 | 1.9200 | 31.680 | 0.95000 | 4.8000 |
| 3 | 1.4500 | 29.200 | 0.70000 | 6.6000 |
| 4 | 0.89000 | 25.080 | 0.45000 | 10.500 |
| 5 | 0.37700 | 17.540 | 0.35000 | 21.000 |

As is clear from the above table 2, at 2.39Ω which is approximately equal to $R_0$=2Ω, the output power of the power amplifier 1 shows 2.68 W. At 4.8Ω which is approximately equal to $R_0$=5Ω, the output power of the power amplifier 1 shows 1.9 W. At 10.5Ω which is approximately equal to $R_0$=10Ω, the output power of the power amplifier 1 shows 0.8 W. At 21Ω which is approximately equal to $R_0$=20Ω, the output power of the power amplifier 1 shows 0.37 W.

Specifically, it is to be understood that impedances cannot be properly matched to the load 4 if the impedances within the matching circuit 3 are not changed in response to output power as shown on the table 1 when the output power of the power amplifier 1 is large at about $R_0$=2Ω and when the output power of the power amplifier 1 is small at about $R_0$=20Ω.

However, since the practical portable wireless telephone set cannot change the impedances within the matching circuit 3 obtained when impedances are properly matched in response to output power, in actual practice, the values of the impedances ($C_1$, $L_2$, $C_3$) within the matching circuit 3 are determined in such a manner that impedances may be properly matched at the maximum output power ($R_0$=2Ω).

Figure 7:
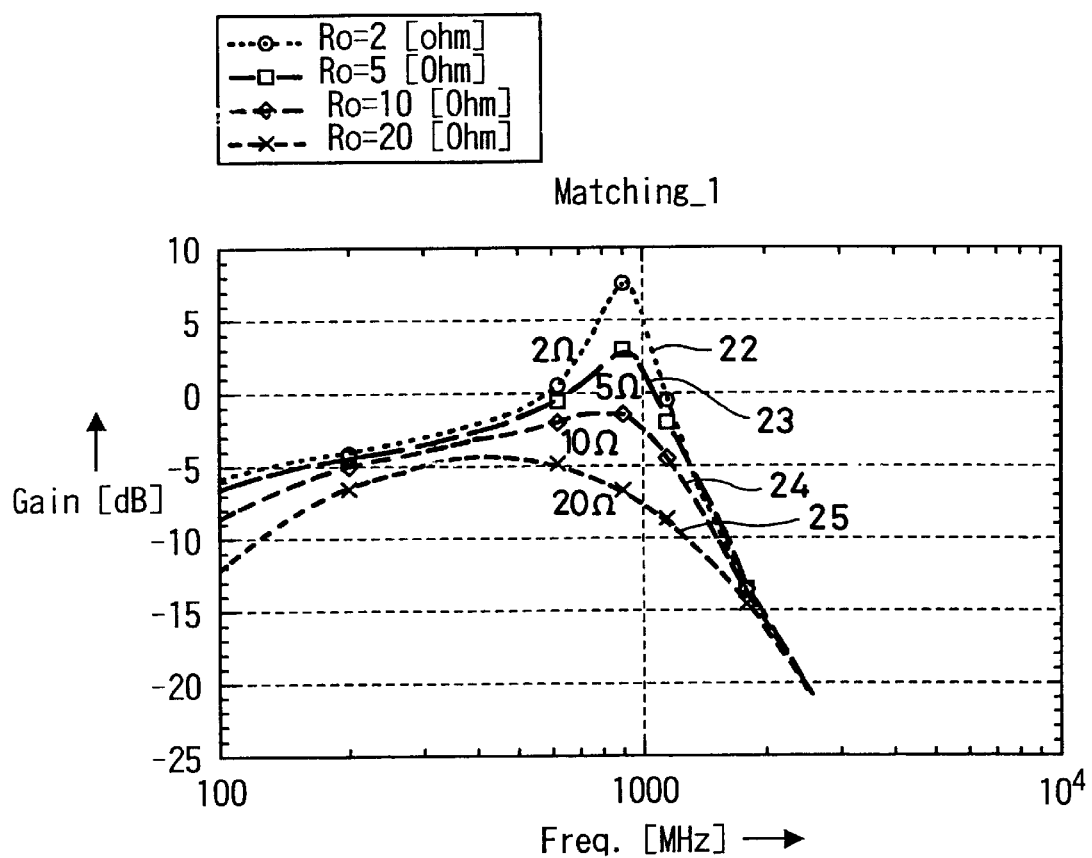
FIG. 7 is a diagram of frequency-gain characteristic curves obtained when output resistance of a power amplifier is used as a parameter and to which reference will be made in explaining the matching apparatus of the present invention.

FIG. 7 shows frequency versus gain characteristic curves obtained when impedances are matched at the maximum output power ($R_0$=2Ω) and the output resistance $R_0$ is progressively increased in such a way as in $R_0$=2Ω, $R_0$=5Ω, $R_0$=10Ω and $R_0$=20Ω, i.e., output power is progressively decreased. When the output power is progressively decreased from a properly-matched characteristic curve 22, a mismatching occurs as shown by characteristic curves 23 to 25 with the result that output efficiencies are considerably deteriorated as shown on a table 3.

TABLE 3

| | GSM Power | | No. 1 | |
|---|---|---|---|---|
| CLASS | Power [dBm] | Power [mW] | Efficiency [%] | Current [mA] |
| 0–2 | 39 | 7943.28 | | |
| 3 | 37 | 5011.87 | | |
| 4 | 35 | 3162.28 | 50 | 247.05 |
| 5 | 33 | 1995.26 | 50 | 155.88 |
| 6 | 31 | 1258.93 | 36 | 136.60 |
| 7 | 29 | 794.33 | 28 | 110.82 |
| 8 | 27 | 501.19 | 23 | 85.12 |
| 9 | 25 | 316.23 | 19 | 65.01 |
| 10 | 23 | 199.53 | 15 | 51.96 |
| 11 | 21 | 125.89 | 12 | 40.98 |
| 12 | 19 | 79.43 | 9 | 34.48 |
| 13 | 17 | 50.12 | 7 | 27.97 |
| 14 | 15 | 31.82 | 5 | 24.71 |
| 15 | 13 | 19.95 | 4 | 19.48 |
| 16 | 11 | 12.59 | 3 | 16.39 |
| 17 | 9 | 7.94 | 2 | 15.51 |
| 18 | 7 | 5.01 | 1.5 | 13.05 |
| 19 | 5 | 3.16 | 1 | 12.35 |

The above table 3 shows output power [Power (dBm), Power (mW)] and output efficiency [Efficiency (%)] and output current value [Current (mA)] measured by a TPC system of a frequency band of 900 MHz decided by European Standards of GSM (Global System for Mobile Communication) digital mobile communication. In the classes 1 to 19, output power is switched at every 2 dB by an instruction data code from the base station 11 side.

Figure 6:
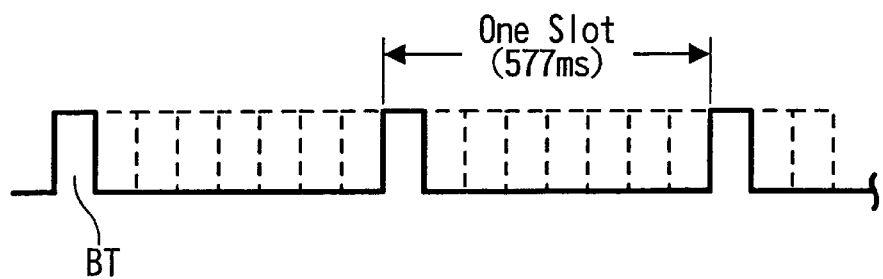
FIG. 6 is a waveform diagram useful for explaining a boost transmission output power used in the present invention.

Since the output current values of the power amplifier 1 shown by No. 1 on the above table 3 indicate a burst transmission value (BT) of ⅛ of one slot (577 ms) as shown in FIG. 6 in actual practice, an output current value 155.88 mA at 33 dBm (about 2 W) of class 5, for example, is calculated by electric power eight times as large as the original electric power.

From the table 3, for example, it is clear that the output efficiency of 50% at the Power 33 dBm is lowered to the output efficiency of 7% at the Power 13 dBm.

Figure 3:
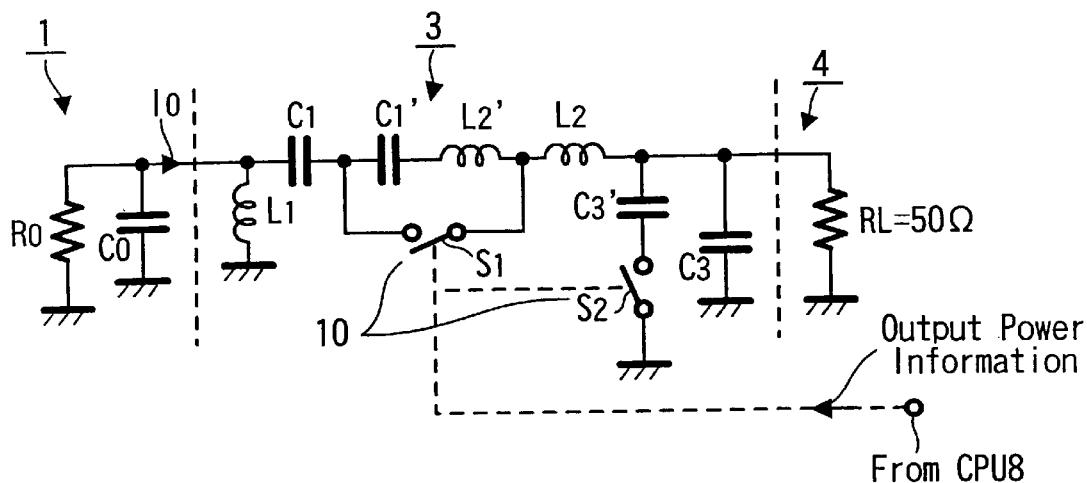
FIG. 3 is a circuit diagram showing a matching apparatus according to an embodiment of the present invention.
Figure 4:
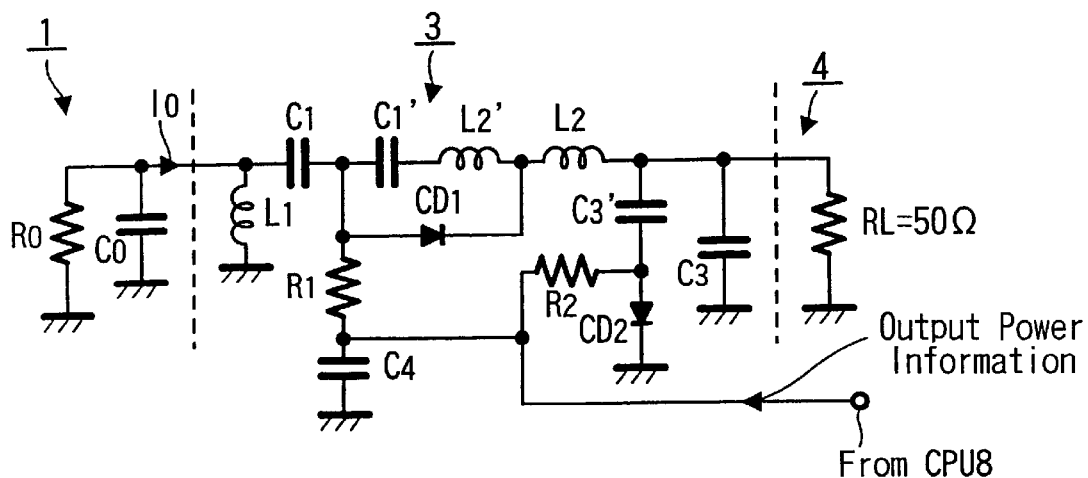
FIG. 4 is a circuit diagram showing a matching apparatus according to another embodiment of the present invention.

Accordingly, in the present invention, the matching circuit 3 is constructed as shown in FIGS. 3 and 4. In the matching circuit 2 shown in FIGS. 3 and 4, elements and parts corresponding to those of FIG. 2 are marked with the same references.

In this embodiment, one ends of the output resistance $R_0$ and the output capacitance $C_0$ of the power amplifier 1 are both connected to the ground, the other ends thereof are connected in parallel, and an output current $I_0$ is supplied to the matching circuit 3.

In the matching circuit 3, the other end of the first inductance $L_1$ whose one end is connected to the ground is connected to the other end of the output capacitance $C_0$ of the power amplifier 1 and the first capacitance $C_1$.

A third capacitance $C_1'$, a third inductance $L_2'$ and the second inductance $L_2$ are connected in series to the first capacitance $C_1$, and the other end of the second inductance $L_2$ is connected in series to a load resistance $R_L$ of the antenna 4 and whose one end is connected to the ground.

The other end of the second inductance $L_2$ is connected to the other end of the second capacitance $C_3$ connected in parallel to the first inductance $L_1$ and whose one end is connected to the ground. The other end of the inductance $L_2$ is connected to a fourth capacitance $C_3'$ connected to a second switch $S_2$ in series, the second switch $S_2$ being connected in parallel to the first inductance $L_1$ and whose one end being connected to the ground. A first switch $S_1$ is adapted to shunt a series circuit of the third capacitance $C_1'$ and the third inductance $L_2'$. The first and second switches $S_1$ and $S_2$ may operate in unison with each other and constitute a switching means 10. This switching means 10 is changed in position in response to output power information from the CPU 8.

In the above arrangement, the impedances ($C_1$, $L_2$, $C_3$) obtained when they are properly matched at the maximum output power ($R_0=2\Omega$) and impedances ($C_1'$, $L_2'$, $C_3'$) obtained when they are properly matched at small power ($R_0=10\Omega$) take the following values based on the formula 1.

| | |
|---|---|
| $C_1$ = 29.4 (PF) | $C_1'$ = 7.3 (PH) |
| $L_2$ = 6.05 (nH) | $L_2'$ = 2.79 (nH) |
| $C_3$ = 7.1 (PF) | $C_3'$ = 10.2 (PH) |

Since the CPU 8 selects the values of the third capacitance $C_1'$ and the third inductance $L_2'$ and the fourth capacitance $C_3'$ as described above and outputs output power information to the switching means 10 based on the present output power of the power amplifier 1 when the first and second switches $S_1$ and $S_2$ are closed, the third capacitance $C_1'$ and the third inductance $L_2'$ are shunted by the first switch $S_1$ and the fourth capacitance $C_3'$ also is grounded through the second switch $S_2$ so that the matching is conducted with the maximum output power ($R_0=2\Omega$) shown in FIG. 2.

If the first and second switches $S_1$ and $S_2$ of the switching means 10 are closed, then matching is conducted with the small output power ($R_0=10\Omega$).

While the mechanical first and second switches $S_1$ and $S_2$ are provided as the switching means 10 shown in FIG. 3, as shown in FIG. 4, the switches $S_1$ and $S_2$ may be replaced with pin diodes $CD_1$ and $CD_2$ and "ON" signal and "OFF" signal may be outputted from the CPU 8 through bias resistances $R_1$ and $R_2$ as output information so that when "ON" signal is outputted, matching may be conducted with the maximum output power and that when "OFF" signal is outputted, matching may be conducted with a predetermined middle or low power.

Figure 5:
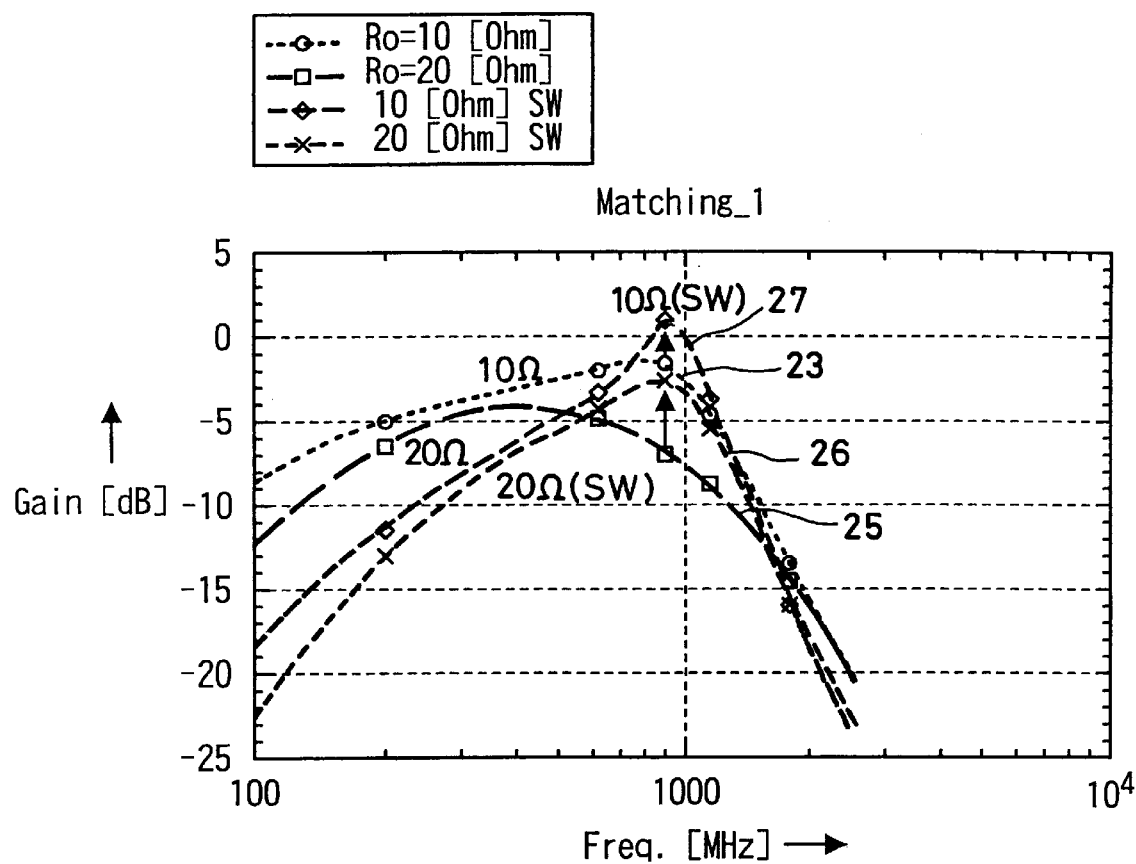
FIG. 5 is a diagram of frequency-gain characteristic curves used to demonstrate switching effects of the matching apparatus according to the present invention.

FIG. 5 shows frequency-gain characteristics obtained when $R_0=10\Omega$ and $R_0=20\Omega$ are switched by the switching means 10 at the constants of the respective impedances of the matching circuit 3 in which it is properly matched by the output load $R_0=20\Omega$ in the arrangements shown in FIGS. 3 and 4.

Characteristic curves 26 and 27 in FIG. 5 indicate characteristics obtained after $R_0=20\Omega$ and $R_0=10\Omega$ had been switched. As is clear from these characteristics, while the maximum gain was −1.7 dB as shown by a characteristic curve 23 when $R_0=10\Omega$ data is not switched, the maximum gain obtained after the above data had been switched is +0.8 dB as shown by the characteristic curve 27.

Similarly, when the maximum gain was −6.94 dB as shown by a curve 25 when $R_0=20\Omega$ is not switched, the maximum gain obtained after data had been switched becomes −2.7 dB as shown by the characteristic curve 26. Thus, it can be understood that the maximum gains were both increased.

While the impedance is switched in two stages of the maximum output and the predetermined small level output in the above embodiments, it is clear that the output power required when the impedances are switched may be selected at least in two stages or more by the proper output power. It is possible that the impedances may be switched at the output power position with the highest frequency in which the power is used in the TPC.

According to the matching apparatus of the present invention, upon predetermined output power, since the impedance is switched and controlled in such a manner that the output impedance of the power amplifier and the impedance of the load such as an antenna are matched with each other, the power amplifier can be driven at the maximum efficiency regardless of the magnitude of the output power such as the maximum output power, the middle and small level output power. Further, the impedance can be switched and controlled by the output from the CPU and the like. Since the detector for detecting the present transmission power also is housed within the portable wireless telephone set, when this detector is in use, the impedance matching can be carried out only by software, and the matching apparatus can be constructed inexpensively. Furthermore, in the predetermined output power which uses much output power upon TPC, since the impedances are switched, controlled and properly matched, it becomes possible to obtain a transmission section in which the maximum output efficiency and the stability can be achieved as the portable wireless telephone set.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A matching apparatus, comprising:

power amplifying means for transmitting output power based on a command instructing an output;

output power detecting means for detecting a level of said output power;

matching means connected between said power amplifying means and a load; and switching means including in the matching means for switching an input impedance and an output impedance of said matching means in response to said level of said output power detected by said output power detecting means.

2. The matching apparatus according to claim 1, wherein said switching means performs said switching in multiple stages in response to said level of said output power detected by said output power detecting means.

3. The matching apparatus according to claim 1 or claim 2, wherein when a maximum output power is transmitted from an output end of said power amplifying means matching is conducted with said matching means; and when said output power is decreased from said maximum output power to a predetermined output power, a switching signal for switching said input impedance and said output impedance so that said matching means is matched to said predetermined output power is output.

* * * * *